United States Patent
Himori et al.

(10) Patent No.: US 8,284,538 B2
(45) Date of Patent: *Oct. 9, 2012

(54) ELECTROSTATIC CHUCK DEVICE

(75) Inventors: Shinji Himori, Nirasaki (JP); Shoichiro Matsuyama, Nirasaki (JP); Atsushi Matsuura, Nirasaki (JP); Hiroshi Inazumachi, Funabashi (JP); Mamoru Kosakai, Narashino (JP); Yukio Miura, Funabashi (JP); Keigo Maki, Ichikawa (JP)

(73) Assignees: Tokyo Electron Limited (JP); Sumitomo Osaka Cement Co., Ltd. (JP)

( * ) Notice: Subject to any disclaimer, the term of this patent is extended or adjusted under 35 U.S.C. 154(b) by 1111 days.

This patent is subject to a terminal disclaimer.

(21) Appl. No.: 11/835,743

(22) Filed: Aug. 8, 2007

(65) Prior Publication Data

US 2008/0062611 A1 Mar. 13, 2008

Related U.S. Application Data

(60) Provisional application No. 60/828,405, filed on Oct. 6, 2006.

(30) Foreign Application Priority Data

Aug. 10, 2006 (JP) ................. 2006-218447

(51) Int. Cl.
    H01L 21/687 (2006.01)
(52) U.S. Cl. ...................................... 361/234
(58) Field of Classification Search .......... 361/234
    See application file for complete search history.

(56) References Cited

U.S. PATENT DOCUMENTS

| 6,028,762 | A |   | 2/2000  | Kamitani |         |
| 6,108,210 | A | * | 8/2000  | Chung    | 361/747 |
| 6,134,096 | A |   | 10/2000 | Yamada   |         |
| 6,483,690 | B1 |  | 11/2002 | Nakajima |         |
| 6,580,035 | B1 | * | 6/2003 | Chung    | 174/255 |
| 7,525,787 | B2 |  | 4/2009  | Dhindsa  |         |

(Continued)

FOREIGN PATENT DOCUMENTS

JP    05-206254    8/1993

(Continued)

OTHER PUBLICATIONS

Office Action issued by the Japanese Patent Office on Sep. 13, 2011 in connection with corresponding Japanese Patent Application No. 2006-218446 and English Translation thereof.

(Continued)

*Primary Examiner* — Jared Fureman
*Assistant Examiner* — Nicholas Ieva
(74) *Attorney, Agent, or Firm* — Ostrolenk Faber LLP

(57) ABSTRACT

An electrostatic chuck device includes an electrostatic chuck section, a metal base section, and a dielectric plate. The electrostatic chuck section has a substrate, a main surface of which serves as a mounting surface for a plate-like sample, an electrostatic-adsorption inner electrode built in the substrate, and a power supply terminal for applying a DC voltage to the electrostatic-adsorption inner electrode. Here, a dielectric plate is fixed to a concave portion formed in the metal base section. The dielectric plate and the electrostatic chuck section are adhesively bonded to each other with an insulating adhesive bonding layer interposed therebetween. The dielectric plate and the concave portion are adhesively bonded to each other with a conductive adhesive bonding layer interposed therebetween, the volume resistivity of which is $1.0 \times 10^{-2}$ Ωcm or less.

15 Claims, 6 Drawing Sheets

U.S. PATENT DOCUMENTS

| | | |
|---|---|---|
| 7,619,870 B2 * | 11/2009 | Himori et al. ............... 361/234 |
| 2005/0098120 A1 * | 5/2005 | Maki ............................ 118/728 |
| 2005/0215073 A1 * | 9/2005 | Nakamura et al. ............ 438/778 |
| 2005/0276928 A1 | 12/2005 | Okumura |

FOREIGN PATENT DOCUMENTS

| | | |
|---|---|---|
| JP | 06-302678 | 10/1994 |
| JP | 08-186094 | 7/1996 |
| JP | 2004-363552 | 12/2004 |
| JP | 2005-033181 | 2/2005 |

OTHER PUBLICATIONS

Office Action issued by the Japanese Patent Office on Sep. 13, 2011 in connection with corresponding Japanese Patent Application No. 2006-218447 and English Translation thereof.

* cited by examiner

Prior Art

Prior Art

ELECTROSTATIC CHUCK DEVICE

BACKGROUND OF THE INVENTION

1. Field of the Invention

The present invention relates to an electrostatic chuck device, and more particularly, to an electrostatic chuck device suitable for use in a high-frequency discharge type plasma processing apparatus for applying a high-frequency voltage to an electrode to generate plasma and processing a plate-like sample such as a semiconductor wafer, a metal wafer, and a glass plate by the use of the generated plasma.

Priority is claimed on Japanese Application No. 2006-218447, filed Aug. 10, 2006, which is incorporated herein by reference. This application also claims the benefit pursuant to 35 U.S.C. §102(e) of U.S. Provisional Application No. 60/828,405, filed on Oct. 6, 2006.

2. Description of the Related Art

Conventionally, plasma was often used in processes such as etching, deposition, oxidation, and sputtering for manufacturing semiconductor devices such as IC, LSI, and VLSI or flat panel displays (FPD) such as a liquid crystal display, in order to allow a process gas to react sufficiently at a relatively low temperature. In general, methods of generating plasma in plasma processing apparatuses are roughly classified into a method using glow discharge or high-frequency discharge and a method using microwaves.

FIG. 11 is a cross-sectional view illustrating an example of an electrostatic chuck device 1 mounted on a known high-frequency discharge type plasma processing apparatus. The electrostatic chuck device 1 is disposed in a lower portion of a chamber (not shown) also serving as a vacuum vessel and includes an electrostatic chuck section 2 and a metal base section 3 fixed to the bottom surface of the electrostatic chuck section 2 so as to be incorporated into a body.

The electrostatic chuck section 2 includes a substrate 4, which has a top surface serving as a mounting surface 4a, on which a plate-like sample W such as a semiconductor wafer is disposed, so as to adsorb the plate-like sample W in an electrostatic manner and an electrostatic-adsorption inner electrode 5 built therein; and a power supply terminal 6 for applying a DC voltage to the electrostatic-adsorption inner electrode 5. A high DC voltage source 7 is connected to the power supply terminal 6. The metal base section 3, which is also used as a high-frequency generating electrode (lower electrode), is connected to a high-frequency voltage generating source 8 and has a flow passage 9 for circulating a cooling medium such as water or an organic solvent formed therein. The chamber is grounded.

The electrostatic chuck device 1 adsorbs the plate-like sample W, by placing the plate-like sample W on the mounting surface 4a and allowing the high DC voltage source 7 to apply a DC voltage to the electrostatic-adsorption inner electrode 5 through the power supply terminal 6. Subsequently, a vacuum is formed in the chamber and a process gas is introduced thereto. Then, by allowing the high-frequency voltage generating source 8 to apply high-frequency power across the metal base section 3 (lower electrode) and an upper electrode (not shown), a high-frequency electric field is generated in the chamber. Frequencies of several tens of MHz or less are generally used as the high frequency.

The high-frequency electric field accelerates electrons, plasma is generated due to ionization by collision of the electrons with the process gas, and a variety of processes can be performed by the use of the created plasma.

In the recent plasma processes, there is an increased need for processes using "low-energy and high-density plasma" having low ion energy and high electron density. In the processes using the low-energy and high-density plasma, the frequency of the high-frequency power for generating plasma might increase greatly, for example, to 100 MHz.

In this way, when the frequency of the power to be applied increases, the electric field strength tends to increase in a region corresponding to the center of the electrostatic chuck section 2, that is, the center of the plate-like disc W, and to decrease in the peripheral region thereof. Accordingly, when the distribution of the electric field strength is not even, the electron density of the generated plasma is not even and thus the processing rate varies depending on in-plane positions in the plate-like sample W. Therefore, there is a problem in that it is not possible to obtain a processing result excellent in in-plane uniformity.

A plasma processing apparatus 11 shown in FIG. 12 has been suggested to solve such a problem (see Patent Literature 1).

In the plasma processing apparatus 11, in order to improve the in-plane uniformity of the plasma process, a dielectric layer 14 made of ceramics or the like is buried at the central portion on the surface of the lower electrode (metal base section) 12 supplied with the high-frequency power and opposed to the upper electrode 13, thereby making the distribution of the electric field strength even. In the figure, reference numeral 15 denotes a high frequency generating power source, PZ denotes plasma, E denotes electric field strength, and W denotes a plate-like sample.

In the plasma processing apparatus 11, when the high frequency generating power source 15 applies the high-frequency power to the lower electrode 12, high-frequency current having been transmitted on the surface of the lower electrode 12 and having reached the top due to a skin effect flows toward the center along the surface of the plate-like sample W, and a part thereof leaks toward the lower electrode 12 and then flows outward inside the lower electrode 12. In this course, the high-frequency current is submerged deeper in the region provided with the dielectric layer 14 than the region not provided with the dielectric layer 14, thereby generating hollow cylindrical resonance of a TM mode. As a result, the electric field strength at the center supplied to the plasma from the surface of the plate-like sample W is weakened and thus the in-plane electric field of the plate-like sample W is made to be uniform The plasma process is often performed under depressurized conditions close to a vacuum. In this case, an electrostatic chuck device shown in FIG. 13 is often used to fix the plate-like sample W.

The electrostatic chuck device 16 has a structure such that a conductive electrostatic-adsorption inner electrode 18 is built in a dielectric layer 17. For example, the conductive electrostatic inner electrode is interposed between two dielectric layers formed by thermally spraying alumina or the like.

The electrostatic chuck device 16 adsorbs and fixes the plate-like sample W by the use of the electrostatic adsorption force generated on the surface of the dielectric layer 17 by allowing the high DC voltage source 7 to apply the high DC power to the electrostatic-adsorption inner electrode 18.

[Patent Literature 1] Japanese Patent Unexamined Publication No. 2004-363552 (see paragraphs 0084 and 0085 of page 15 and FIG. 19)

In the known plasma processing apparatus 11 described above, when the electrostatic chuck device 16 processes the plate-like sample W by the use of the plasma in a state where it is disposed on the lower electrode 12, the high-frequency current does not pass through the electrostatic-adsorption inner electrode 18 of the electrostatic chuck device 16 and thus a flow of current directed to the outside from the electrostatic-adsorption inner electrode 18 is generated.

In other words, since the electrostatic-adsorption inner electrode 18 is disposed in the electrostatic chuck device 16, the dielectric layer 14 is not viewed from the plasma PZ and thus an effect of lowering the potential of the plasma in the region in which the dielectric layer 14 is buried cannot be exhibited.

As a result, the potential of the plasma above the central portion of the plate-like sample W is high and the potential above the peripheral portion is low, thereby making the processing rate different between the central portion and the peripheral portion of the plate-like sample W. Accordingly, this is a reason for in-plane unevenness of the plasma process such as etching.

SUMMARY OF THE INVENTION

The invention is made to solve the above-mentioned problems. An object of the invention is to provide an electrostatic chuck device which can enhance in-plane uniformity of the electric field strength in plasma and can perform a plasma process with high in-plane uniformity on a plate-like sample, when it is applied to a plasma processing apparatus.

As a result of keen studies for accomplishing the above-mentioned object, the inventors found out that the above-mentioned object could be efficiently accomplished by employing one of the following configurations (1) and (2) and thus completed the invention.

(1) A concave portion is formed in a main surface of a metal base section facing an electrostatic chuck section, a dielectric plate is fixed to the concave portion, the dielectric plate and the electrostatic chuck section are adhesively bonded to each other with an insulating adhesive bonding layer interposed therebetween, and the dielectric plate and the concave portion are adhesively bonded to each other with a conductive adhesive bonding layer interposed therebetween, the volume resistivity of which is $1.0 \times 10^{-2}$ Ωcm or less.

(2) A concave portion is formed in a main surface of the metal base section facing an electrostatic chuck section, the electrostatic chuck section is fixed to the concave portion, and the electrostatic chuck section and the concave portion are adhesively bonded to each other with a conductive adhesive bonding layer interposed therebetween, the volume resistivity of which is $1.0 \times 10^{-2}$ Ωcm or less.

That is, according to an aspect of the invention, there is provided an electrostatic chuck device including: an electrostatic chuck section including a substrate, which has a main surface serving as a mounting surface on which a plate-like sample is mounted and an electrostatic-adsorption inner electrode built therein, and a power supply terminal for applying a DC voltage to the electrostatic-adsorption inner electrode; and a metal base section that is fixed to the other main surface of the substrate of the electrostatic chuck section so as to be incorporated into a body and that serves as a high frequency generating electrode. Here a concave portion is formed in the main surface of the metal base section facing the electrostatic chuck section and a dielectric plate is fixed to the concave portion. The dielectric plate and the electrostatic chuck section are adhesively bonded to each other with an insulating adhesive bonding layer interposed therebetween, and wherein the dielectric plate and the concave portion are adhesively bonded to each other with a conductive adhesive bonding layer interposed therebetween, the volume resistivity of which is $1.0 \times 10^{-2}$ Ωcm or less.

In the electrostatic chuck device, it is preferable that the thickness of the dielectric plate decrease from the center to the peripheral edge.

In the electrostatic chuck device, it is preferable that the clearance between the dielectric plate and the concave portion be 0.1% or more of a diameter when the dielectric plate is circular and 0.1% or more of a diagonal length of a rectangular when the dielectric plate is rectangular.

In the electrostatic chuck device, it is preferable that the clearance between the dielectric plate and the concave portion be 2.0 mm or less.

In the electrostatic chuck device, it is preferable that the concave portion have a shape complementary to that of the main surface of the dielectric plate facing the concave portion.

In the electrostatic chuck device, it is preferable that the thermal conductivity between the electrostatic chuck section and the metal base section be uniform in the entire adsorption area of the electrostatic chuck section.

In the electrostatic chuck device, it is preferable that the conductive adhesive bonding layer include a silicon-based adhesive bonding agent containing a conductive filler or a metal-based adhesive bonding agent.

In the electrostatic chuck device, it is preferable that the electrostatic-adsorption inner electrode include a plurality of concentric electrode portions insulated from each other and the power supply terminal be connected to the respective electrode portions.

In the electrostatic chuck device, it is preferable that an opening having an area in the range of ⅕ to ⅘ of the entire area of the electrostatic-adsorption inner electrode be formed at the central portion of the electrostatic-adsorption inner electrode and the opening be filled with an insulating material.

According to another aspect of the invention, there is provided an electrostatic chuck device including: an electrostatic chuck section including a substrate, which has a main surface serving as a mounting surface on which a plate-like sample is mounted and an electrostatic-adsorption inner electrode built therein, and a power supply terminal for applying a DC voltage to the electrostatic-adsorption inner electrode; and a metal base section that is fixed to the other main surface of the substrate of the electrostatic chuck section so as to be incorporated into a body and that serves as a high frequency generating electrode. Here a concave portion is formed in a main surface of the metal base section facing the electrostatic chuck section and the electrostatic chuck section is fixed to the concave portion. The electrostatic chuck section and the concave portion are adhesively bonded to each other with a conductive adhesive bonding layer interposed therebetween, the volume resistivity of which is $1.0 \times 10^{-2}$ Ωcm or less.

In the electrostatic chuck device, it is preferable that the thickness of the substrate decrease from the center to the peripheral edge.

In the electrostatic chuck device, it is preferable that the clearance between the substrate and the concave portion be 0.1% or more of a diameter when the substrate is circular and 0.1% or more of a diagonal length of a rectangular when the substrate is rectangular.

In the electrostatic chuck device, it is preferable that the clearance between the substrate and the concave portion be 2.0 mm or less.

In the electrostatic chuck device, it is preferable that the concave portion have a shape complementary to that of the other main surface of the substrate.

In the electrostatic chuck device, it is preferable that the thermal conductivity between the electrostatic chuck section and the metal base section be uniform in the entire adsorption area of the electrostatic chuck section.

In the electrostatic chuck device, it is preferable that the conductive adhesive bonding layer include a silicon-based adhesive bonding agent containing a conductive filler or a metal-based adhesive bonding agent.

In the electrostatic chuck device, it is preferable that the electrostatic-adsorption inner electrode include a plurality of concentric electrode portions insulated from each other and the power supply terminal be connected to the respective electrode portions In the electrostatic chuck device, it is preferable that an opening having an area in the range of 1/9 to 4/9 of the entire area of the electrostatic-adsorption inner electrode be formed at the central portion of the electrostatic-adsorption inner electrode and the opening be filled with an insulating material.

In the electrostatic chuck device according to one aspect of the invention, the concave portion is formed in the main surface of the metal base section facing the electrostatic chuck section, the dielectric plate is fixed to the concave portion, and the dielectric plate and the electrostatic chuck section are adhesively bonded to each other with the insulating adhesive bonding layer interposed therebetween. Accordingly, when a high-frequency voltage is applied to the metal base section, high-frequency current can pass through the insulating adhesive bonding layer and the high-frequency current can be prevented from flowing toward the outer peripheral portion through the insulating adhesive bonding layer, thereby making even the electric field strength on the surface of the electrostatic chuck section. Therefore, it is possible to make even the plasma density on the surface of the plate-like sample and thus to perform a uniform plasma process on the entire surface of the plate-like sample.

The dielectric plate and the concave portion are adhesively bonded to each other with the conductive adhesive bonding layer interposed therebetween, the volume resistivity of which is $1.0 \times 10^{-2}$ Ωcm or less. Accordingly, when bubbles or defects occur in the conductive adhesive bonding layer, the dielectric constant of the conductive adhesive bonding layer does not vary, thereby not disturbing the plasma distribution. Therefore, it is possible to make even the plasma density on the surface of the plate-like sample and thus to perform a uniform plasma process on the entire surface of the plate-like sample.

As described above, when the thickness of the dielectric plate decreases from the center to the peripheral edge, it is possible to make even the plasma distribution in which a portion closer to the center has a higher density and thus to make uniform the plasma density on the surface of the plate-like sample.

As described above, by setting the clearance between the dielectric plate and the concave portion to 0.1% or more of a diameter when the dielectric plate is circular and to 0.1% or more of a diagonal length of a rectangle when the dielectric plate is rectangular, warping of the metal base section due to a difference in thermal expansion coefficient between the dielectric plate and the metal base section, damage of the dielectric plate or the substrate oh the electrostatic chuck section due to the warping, peeling-off of the adhesive bonding layer between the metal base section and the dielectric plate, and peeling-off of the adhesive bonding layer between the dielectric plate and the electrostatic chuck section can be prevented.

As described above, when the clearance between the dielectric plate and the concave portion is set to 2.0 mm or less, it is possible to enhance the in-plane thermal uniformity of the plate-like sample and to perform a uniform plasma process.

As described above, when the concave portion has a shape complementary to that of the main surface of the dielectric plate facing the concave portion, it is possible to easily and satisfactorily position and fix the metal base section and the dielectric plate relative to each other.

As described above, when the thermal conductivity between the electrostatic chuck section and the metal base section is made to be constant in the entire adsorption area of the electrostatic chuck section, it is possible to enhance the in-plane thermal uniformity of the plate-like sample and to perform a uniform plasma process.

In the electrostatic chuck device according to another aspect of the invention, the concave portion is formed in the main surface of the metal base section facing the electrostatic chuck section, the electrostatic chuck section is fixed to the concave portion, and the electrostatic chuck section and the concave portion are adhesively bonded to each other with the conductive adhesive bonding layer interposed therebetween, the volume resistivity of which is $1.0 \times 10^{-2}$ Ωcm or less. Accordingly, when bubbles or defects occur in the conductive adhesive bonding layer, the dielectric constant of the conductive adhesive bonding layer does not vary, thereby not disturbing the plasma distribution. Therefore, it is possible to make even the plasma density on the surface of the plate-like sample and thus to perform a uniform plasma process on the entire surface of the plate-like sample.

Since the electrostatic chuck device is fixed to the concave portion of the metal base section, it is possible to easily position and fix the metal base section and the electrostatic chuck section relative to each other.

As described above, by decreasing the thickness of the substrate from the center to the peripheral edge, it is possible to make even the plasma distribution in which a portion closer to the center has a higher density and thus to make more even the plasma density on the surface of the plate-like sample.

As described above, by setting the clearance between the substrate and the concave portion to 0.1% or more of a diameter when the substrate is circular and to 0.1% or more of a diagonal length of a rectangle when the substrate is rectangular, warping of the metal base section due to a difference in thermal expansion coefficient between the electrostatic chuck section and the metal base section, damage of the substrate of the substrate of the electrostatic chuck section due to the warping, peeling-off of the adhesive bonding layer between the metal base section and the electrostatic chuck section can be prevented.

As described above, when the clearance between the dielectric plate and the concave portion is set to 2.0 mm or less, it is possible to enhance the in-plane thermal uniformity of the plate-like sample and to perform a uniform plasma process.

As described above, when the concave portion has a shape complementary to that of the main surface of the substrate, it is possible to easily and satisfactorily position and fix the metal base section and the substrate relative to each other.

As described above, when the thermal conductivity between the electrostatic chuck section and the metal base section is made to be constant in the entire adsorption area of the electrostatic chuck section, it is possible to enhance the in-plane thermal uniformity of the plate-like sample and to perform a uniform plasma process.

As described above, when the conductive adhesive bonding layer includes a silicon-based adhesive bonding agent containing a conductive filler or a metal-based adhesive bonding agent, it is possible to easily adjust the volume resistivity of the conductive adhesive bonding agent to $1.0 \times 10^{-2}$ Ωcm or less.

As described above, the electrostatic-adsorption inner electrode includes a plurality of concentric electrode portions electrically isolated from each other and the power supply terminals are connected to the electrode portions, respectively. In this state, when a high-frequency voltage is applied, it is possible to effectively prevent a high-frequency current from flowing toward the outer peripheral edge through the electrostatic-adsorption inner electrode and thus to make more even the plasma distribution in which a portion closer to the center has a higher density.

As described above, the opening having an area in the range of 1/5 to 4/5 of the entire area of the electrostatic-adsorption inner electrode is formed at the center of the electrostatic-adsorption inner electrode and the opening is filled with an insulating material. In this state, when a high-frequency voltage is applied, it is possible to effectively prevent a high-frequency current from flowing toward the outer peripheral edge through the electrostatic-adsorption inner electrode and thus to make more even the plasma distribution in which a portion closer to the center has a higher density.

DETAILED DESCRIPTION OF THE INVENTION

First Embodiment

Figure 1:
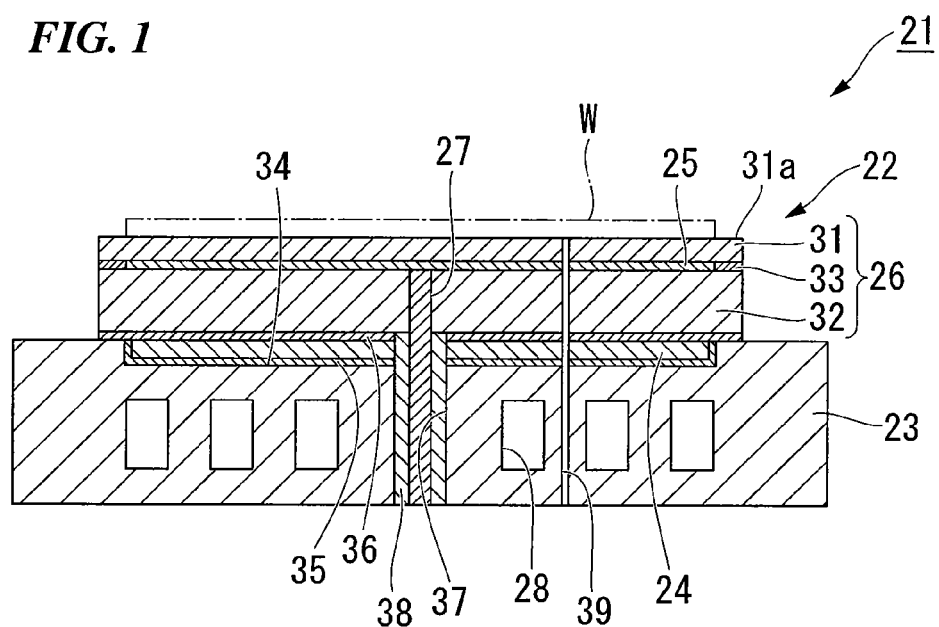
FIG. 1 is a cross-sectional view illustrating an electrostatic chuck device according to a first embodiment of the invention.

FIG. 1 is a cross-sectional view illustrating a unipolar electrostatic chuck device 21 according to a first embodiment of the invention. The electrostatic chuck device 21 includes an electrostatic chuck section 22, a metal base section 23, and a dielectric plate 24.

The electrostatic chuck section 22 includes a disc-like substrate 26, the top surface (one main surface) of which serves as a mounting surface for mounting a plate-like sample W and in which an electrostatic-adsorption inner electrode 25 is built, and a power supply terminal 27 for applying a DC voltage to the electrostatic-adsorption inner electrode 25.

The substrate 26 roughly includes a disc-like mounting plate 31 of which the top surface 31a serves as the mounting surface for mounting the plate-like sample W such as a semiconductor wafer, a metal wafer, and a glass plate, a disc-like support plate 32 disposed opposite the bottom surface (the other main surface) of the mounting plate 31, a circular electrostatic-adsorption inner electrode 25 interposed between the mounting plate 31 and the support plate 32, and a ring-like insulating layer 33 disposed on the outer periphery thereof so as to surround the inner electrode 25.

On the other hand, a flow passage 28 for circulating a cooling medium such as water or an organic solvent is formed in the metal base section 23 so as to maintain the plate-like sample W mounted on the mounting surface at a desired temperature. The metal base section 23 is also used as a high frequency generating electrode.

A circular concave portion 34 is formed in the surface (main surface) of the metal base section 23 facing the electrostatic chuck section 22 and the dielectric plate 24 is adhesively bonded to the concave portion 34 with a conductive adhesive bonding layer 35 interposed therebetween, the volume resistivity of which is $1.0 \times 10^{-2}$ Ωcm or less. The dielectric plate 24 and the support plate 32 of the electrostatic chuck section 22 are adhesively bonded to each other with an insulating adhesive bonding layer 36 interposed therebetween.

Here, by adhesively bonding the dielectric plate 24 and the concave portion 34 to each other with the conductive adhesive bonding layer 35 interposed therebetween, the volume resistivity of which is $1.0 \times 10^{-2}$ Ωcm or less, the dielectric constant of the conductive adhesive bonding layer 35 is even and the plasma distribution is not disturbed, when bubbles or defects are formed in the conductive adhesive bonding layer 35. Accordingly, the plasma density on the surface of the plate-like sample W is even and thus it is possible to perform a uniform plasma process on the entire surface of the plate-like sample W.

By adhesively bonding the dielectric plate 24 and the support plate 32 of the electrostatic chuck section 22 to each other with the insulating adhesive bonding layer 36 having a dielectric constant smaller than that of any one of the dielectric plate 24 and the support plate 32 of the substrate 26, high-frequency current passes through the insulating adhesive bonding layer 36 and the high-frequency current is effectively prevented from flowing toward the outer periphery through the insulating adhesive bonding layer 36, thereby making the electric field strength of the surface of the electrostatic chuck section 22 even, when a high-frequency voltage is applied to the metal base section 23. Accordingly, the plasma density on the surface of the plate-like sample W is even and thus it is possible to perform a uniform plasma process on the entire surface of the plate-like sample W.

The thickness of the dielectric plate 24 may be reduced. For example, when a material having high thermal conductivity is used as the insulating adhesive bonding agent, the thermal conductivity between the metal base section 23 and the electrostatic chuck section 22 is enhanced. Accordingly, the in-plane thermal uniformity of the plate-like sample W is enhanced and thus it is possible to perform a uniform plasma process on the entire surface of the plate-like sample W.

A clearance between the dielectric plate 24 and the concave portion 34 is preferably 0.1% or more of a diameter when the dielectric plate 24 is circular, more preferably 0.2% or more, and still more preferably 0.3% or more. The clearance is preferably 0.1% or more of a diagonal length of a rectangle when the dielectric plate 24 is rectangular, more preferably 0.2% or more, and still more preferably 0.3% or more.

Here, when the clearance between the dielectric plate 24 and the concave portion 34 is less than 0.1%, the metal base section 23 may be easily warped due to a difference in thermal expansion coefficient between the dielectric plate 24 and the metal base section 23 to warp the dielectric plate 24 or the substrate 26 of the electrostatic chuck section 22, the adhesive bonding layer 35 between the metal base section 23 and the dielectric plate 24 may be peeled off, or the adhesive bonding layer 36 between the dielectric plate 24 and the substrate 26 of the electrostatic chuck section 22 may be peeled off.

A clearance between the dielectric plate 24 and the concave portion 34 is preferably 2.0 mm or less in numerical value, more preferably 1.5 mm or less, and still more preferably 1.0 mm or less.

When the clearance between the dielectric plate 24 and the concave portion 34 is more than 2.0 mm, the in-plane thermal uniformity of the plate-like sample W is deteriorated and thus the even plasma process may not be obtained.

The conductive adhesive bonding layer 35 is an adhesive bonding layer having conductivity, adhesive bonding property, and heat resistance and having a volume resistivity of $1.0 \times 10^{-2}$ Ωcm or less at the usage temperature of the electrostatic chuck device. For example, an adhesive bonding layer made of a silicon-based adhesive bonding agent containing a conductive filler or a metal-based adhesive bonding agent can be suitably used.

An example of the silicon-based adhesive bonding agent containing a conductive filler can include a silicon-based adhesive bonding agent containing a conductive filler such as Ag, Al, Cu, and carbon (C).

An example of the metal-based adhesive bonding agent can include a soldering material containing metal such as In, Sn, Ag, and Zn.

For example, when the metal base section 23 and the dielectric plate 24 are formed of an aluminum oxide ($Al_2O_3$) sintered body or an aluminum nitride (AlN) sintered body, a silicon-based adhesive bonding agent containing a conductive filler such as Al and Ag or a soldering material containing metal such as In and Sn can be suitably used.

The insulating adhesive bonding layer 36 is not particularly limited so long as it has insulating property, adhesive bonding property, and heat resistance. For example, an adhesive bonding layer made of an insulating adhesive bonding agent such as a silicon-based adhesive bonding agent and an epoxy-based adhesive bonding agent can be suitably used.

For example, when the dielectric plate 24 and the support plate 32 are formed of an aluminum oxide ($Al_2O_3$) sintered body or an aluminum nitride (AlN) sintered body, a silicon-based adhesive bonding agent containing aluminum nitride can be suitably used.

Since the dielectric constant of the silicon-based adhesive bonding agent containing aluminum nitride is smaller than those of the aluminum oxide ($Al_2O_3$) sintered body and the aluminum nitride (AlN) sintered body, it has an excellent characteristic that the high-frequency current generated with an application of a high-frequency voltage to the metal base section 23 can be prevented from flowing to the central portion from the peripheral portion through the surface of the insulating adhesive bonding layer 36 due to the skin effect, thereby making the plasma uniform.

The thermal conductivity of the insulating adhesive bonding layer 36 is preferably 0.3 $W/m^2K$ or more, more preferably 0.5 $W/m^2K$ or more, and still more preferably 1.0 $W/m^2K$ or more.

Here, the reason for limiting the thermal conductivity of the insulating adhesive bonding layer 36 to 0.3 $W/m^2K$ or more is as follows. That is, when the thermal conductivity is less than 0.3 $W/m^2K$, the thermal conduction from the metal base section 23 to the plate-like sample W is deteriorated and thus it is difficult to maintain the plate-like sample W at a desired temperature.

Regarding the adhesive bonding layers 35 and 36, by adjusting the materials and thicknesses of the conductive adhesive bonding layer 35 and the insulating adhesive bonding layer 36 so that the thermal conductivity is made to be constant in the entire adsorption area of the electrostatic chuck section 22, the thermal conductivity between the electrostatic chuck section 22 and the metal base section 23 can be made uniform, thereby enhancing the in-plane thermal uniformity of the plate-like sample W.

For example, when the shape of the surface of the dielectric plate 24 close to the conductive adhesive bonding layer 35 is a concentric step shape or a cone shape of which the central portion is thick and of which the peripheral portion is thin, the central portion of the conductive adhesive bonding layer 35 is made to be thin and the peripheral portion thereof is made to be thick.

When the shape of the surface of the dielectric plate 24 close to the insulating adhesive bonding layer 36 is a concentric step shape or a cone shape of which the central portion is thick and of which the peripheral portion is thin, the central portion of the insulating adhesive bonding layer 36 is made to be thin and the peripheral portion thereof is made to be thick.

Accordingly, the in-plane thermal uniformity of the plate-like sample W is enhanced and the even plasma process is obtained.

A power supply terminal insertion hole 37 is formed in the vicinity of the central portions of the support plate 32 and the metal base section 23 and a power supply terminal 27 for applying a DC voltage to the electrostatic-adsorption inner electrode 25 is inserted into the power supply terminal insertion hole 37 along with a cylindrical insulator 38. The top end of the power supply terminal 27 is electrically connected to the electrostatic-adsorption inner electrode 25.

A cooling gas introduction hole 39 penetrating the mounting plate 31, the support plate 32, the electrostatic-adsorption inner electrode 25, and the metal base section 23 is formed therein and thus a cooling gas such as He is supplied to a gap between the mounting plate 31 and the bottom surface of the plate-like sample W through the cooling gas introduction hole 39.

A top surface 31a of the mounting plate 31 serves as an electrostatic adsorption surface which is mounted with a sheet of the plate-like sample W so as to electrostatically adsorb the plate-like sample W by means of an electrostatic adsorption force. The top surface (electrostatic adsorption surface) 31a is provided with a plurality of cylindrical protrusions (not shown) having a substantially circular section along the top surface 31a and the top surfaces of the protrusions are parallel to the top surface 31a.

A wall portion (not shown) that continuously extends along the peripheral portion and that has the same height as the protrusions so as not to leak the cooling gas such as He is formed in the peripheral portion of the top surface 31a so as to surround the peripheral portion of the top surface 31a circularly.

The electrostatic chuck device 21 having the above-mentioned configuration is placed in a chamber of a plasma processing apparatus such as a plasma etching apparatus, a plate-like sample W is mounted on the top surface 31a of the mounting surface, and then a variety of plasma processes can be performed on the plate-like sample W by applying a high-frequency voltage across the metal base section 23 also serving as a high frequency generating electrode and the upper electrode to generate plasma on the mounting plate 31 while applying a predetermined DC voltage to the electrostatic-adsorption inner electrode 25 through the power supply terminal 27 to adsorb and fix the plate-like sample W by the use of an electrostatic force.

Next, the elements of the electrostatic chuck device will be described in more detail.

"Mounting Plate and Support Plate"

The mounting plate 31 and the support plate 32 are both made of ceramics.

Ceramics including one kind selected from or complex ceramics including two or more kinds selected from aluminum nitride (AlN), aluminum oxide ($Al_2O_3$), silicon nitride ($Si_3N_4$), zirconium oxide ($ZrO_2$), sialon, boron nitride (BN), and silicon carbide (SiC) can be preferably used as the ceramics.

The materials may be used alone or in combinations. It is preferable that the thermal expansion coefficient thereof is as close as possible to that of the electrostatic-inner electrode 25 and they can be easily sintered. Since the top surface 31a of the mounting plate 31 serves as an electrostatic adsorption surface, it is preferable that a material having a high dielectric constant and not serving as impurities for the plate-like sample W be selected.

In consideration of the above description, the mounting plate 31 and the support plate 32 are made of a silicon carbide-aluminum oxide complex sintered body in which silicon carbide is contained substantially in the range of 1 wt % to 20 wt % and the balance is aluminum oxide.

When a complex sintered body including aluminum oxide ($Al_2O_3$) and silicon carbide (SiC) of which the surface is coated with silicon oxide ($SiO_2$) is used as the silicon carbide-aluminum oxide complex sintered body and the content of silicon carbide (SiC) is set to the range of 5 wt % to 15 wt % with respect to the entire complex sintered body, the volume resistivity at room temperature (25° C.) is $1.0\times10^{14}$ Ωcm or more and thus the complex sintered body is suitable for the mounting plate 31 of a coulomb type electrostatic chuck device. The complex sintered body is excellent in wear resistance, does not cause contamination of a wafer or generation of particles, and has enhanced in plasma resistance.

When a complex sintered body including aluminum oxide ($Al_2O_3$) and silicon carbide (SiC) is used as the silicon carbide-aluminum oxide complex sintered body and the content of silicon carbide (SiC) is set to the range of 5 wt % to 15 wt % with respect to the entire complex sintered body, the volume resistivity thereof at room temperature (25° C.) is in the range of $1.0\times10^9$ Ωcm to $1.0\times10^{12}$ Ωcm and thus the complex sintered body is suitable for the mounting plate 31 of a Johnson-Rahbeck type electrostatic chuck device. The complex sintered body is excellent in wear resistance, does not cause contamination of a wafer or generation particles, and has enhanced in plasma resistance.

The average particle diameter of silicon carbide particles in the silicon carbide-aluminum oxide complex sintered body is preferably 0.2 μm or less.

When the average particle diameter of the silicon carbide particles is greater than 0.2 μm, the electric field at the time of application of the plasma is concentrated on portions of the silicon carbide particles in the silicon carbide-aluminum oxide complex sintered body, thereby easily damaging the peripheries of the silicon carbide particles.

The average particle diameter of the aluminum oxide particles in the silicon carbide-aluminum oxide complex sintered body is preferably 2 μm or less.

When the average particle diameter of the aluminum oxide particles is greater than 2 μm, the silicon carbide-aluminum oxide complex sintered body is easily etched by the plasma to form sputtering scars, thereby increasing the surface roughness.

"Electrostatic-Adsorption Inner Electrode"

The electrostatic-adsorption inner electrode 25 is formed of flat panel-shaped ceramics with a thickness in the range of about 10 μm to 50 μm and the volume resistivity at the usage temperature of the electrostatic chuck device is preferably in the range of $1.0\times10^{-1}$ Ωcm to $1.0\times10^8$ Ωcm and more preferably in the range of $1.0\times10^2$ Ωcm to $1.0\times10^4$ Ωcm.

Here, the reason for limiting the volume resistivity to the above-mentioned range is as follows. When the volume resistivity is less than $1.0\times10^{-1}$ Ωcm and a high-frequency voltage is applied to the metal base section 23, the high-frequency current does not pass through the electrostatic-adsorption inner electrode 25 and the electric field strength on the surface of the electrostatic chuck section 22 is not even, thereby not obtaining the uniform plasma. On the other hand, when the volume resistivity is greater than $1.0\times10^8$ Ωcm, the electrostatic-adsorption inner electrode 25 substantially becomes an insulator and thus does not function as an electrostatic-adsorption inner electrode so as not to generate an electrostatic adsorption force, or the responsiveness of the electrostatic adsorption force is deteriorated and thus a long time is required for generating the necessary electrostatic adsorption force.

Examples of the ceramics constituting the electrostatic-adsorption inner electrode 25 include the following various complex sintered bodies:

(1) a complex sintered body in which semiconductor ceramics such as silicon carbide (SiC) are added to the insulating ceramics such as aluminum oxide;

(2) a complex sintered body in which conductive ceramics such as tantalum nitride (TaN), tantalum carbide (TaC), and molybdenum carbide ($Mo_2C$) are added to the insulating ceramics such as aluminum oxide;

(3) a complex sintered body in which high melting-point metal such as molybdenum (Mo), tungsten (W), and tantalum (Ta) is added to the insulating ceramics such as aluminum oxide; and (4) a complex sintered body in which a conductive material such as carbon (C) is added to the insulating ceramics such as aluminum oxide.

The volume resistivity of these materials can be easily controlled within the range of $1.0\times10^{-1}$ Ωcm to $1.0\times10^8$ Ωcm by controlling the amount of conductive components added thereto. Specifically, when the mounting plate 31 and the support plate 32 are both made of ceramics, their thermal expansion coefficients are similar to each other and thus the ceramics are suitable as a material for forming the electrostatic-adsorption inner electrode 25.

The shape or size of the electrostatic-adsorption inner electrode 25 can be suitably adjusted. The entire area of the electrostatic-adsorption inner electrode 25 is not necessarily made of a material having a volume resistivity in the range of $1.0\times10^{-1}$ Ωcm to $1.0\times10^8$ Ωcm. 50% or more of the entire area of the electrostatic-adsorption inner electrode 25 and preferably 70% or more thereof may be made of a material having a volume resistivity in the range of $1.0 \times 10^{-1}$ Ωcm to $1.0 \times 10^8$ Ωcm.

"Insulating Layer"

The insulating layer 33 serves to bond the mounting plate 31 and the support plate 32 to each other to form a body and to protect the electrostatic-adsorption inner electrode 25 from plasma or corrosive gas. The insulating layer 33 is preferably made of an insulating material having the same main component as the mounting plate 31 and the support plate 32. For example, when the mounting plate 31 and the support plate 32 are formed of the silicon carbide-aluminum oxide complex sintered body, the insulating layer is preferably made of aluminum oxide ($Al_2O_3$).

"Dielectric Plate"

The dielectric plate 24 serves to decrease the electric field strength at the center of the electrostatic chuck section 22. The electric field strength of the surface of the electrostatic chuck section 22 becomes more even when high-frequency power is applied to the metal base section 23. Accordingly, the plasma density becomes more even.

The dielectric plate 24 can be preferably formed of ceramics having excellent insulating characteristics and thermal conductivity and examples thereof include an aluminum oxide ($Al_2O_3$) sintered body and an aluminum nitride (AlN) sintered body.

The thickness of the dielectric plate 24 is preferably in the range of 1 mm to 15 mm and more preferably in the range of 4 mm to 8 mm.

When the thickness of the dielectric plate 24 is less than 1 mm, the effect sufficient for decreasing the electric field strength at the center of the electrostatic chuck section 22 is not obtained. On the other hand, when the thickness of the dielectric plate 24 is greater than 15 mm, the thermal conductivity from the metal base section 23 to the plate-like sample W is decreased, thereby making it difficult to keep the plate-like sample W at a desired constant temperature.

"Method of Manufacturing Electrostatic Chuck Device"

A method of manufacturing an electrostatic chuck device according to this embodiment will be described.

Described here is an example in which the mounting plate 31 and the support plate 32 are formed of the silicon carbide-aluminum oxide complex sintered body substantially containing silicon carbide in the range of 1 wt % to 20 wt %.

Silicon carbide powder having an average particle diameter of 0.1 μm or less is used as the raw powder of silicon carbide (SiC).

The reason is as follows. When the average particle diameter of the silicon carbide (SiC) powder is greater than 0.1 μm, the average particle diameter of the silicon carbide particles in the obtained silicon carbide-aluminum oxide complex sintered body is greater than 0.2 μm and thus the strength of the mounting plate 31 and the support plate 32 is not sufficiently enhanced.

When the mounting plate 31 formed of the silicon carbide-aluminum oxide complex sintered body is exposed to the plasma, the electric field is concentrated on the silicon carbide (SiC) particles to greatly damage the particles, whereby the plasma resistance may be reduced and the electrostatic adsorption force after the plate damage may be reduced.

The powder obtained by a plasma CVD method is preferably used as the silicon carbide (SiC) powder. Specifically, a super fine powder having an average particle diameter of 0.1 μm or less, which is obtained by introducing raw gas of a silane compound or silicon halide and hydrocarbon into plasma in a non-oxidizing atmosphere and carrying out vapor phase reaction while controlling the pressure of the reaction system in the range of $1 \times 10^5$ Pa (1 atm) to $1.33 \times 10$ Pa (0.1 Torr), has excellent sintering ability, high purity, and spherical particle shapes and thus is excellent in dispersibility when this is formed.

On the other hand, aluminum oxide ($Al_2O_3$) powder having an average particle diameter of 1 μm or less is preferably used as the raw powder of aluminum oxide ($Al_2O_3$).

The reason is as follows. In the silicon carbide-aluminum oxide complex sintered body obtained using the aluminum oxide ($Al_2O_3$) powder having an average particle diameter larger than 1 μm, the average particle diameter of the aluminum oxide ($Al_2O_3$) particles in the complex sintered body is greater than 2 μm. Accordingly, the top surface 31a of the mounting plate 31 on which the plate-like sample is mounted can be easily etched by the plasma to form sputtering scars to increase the surface roughness of the top surface 31a, thereby deteriorating the electrostatic adsorption force of the electrostatic chuck device 21.

The aluminum oxide ($Al_2O_3$) powder is not particularly limited so long as it has an average particle diameter of 1 μm or less and high purity.

Subsequently, the silicon carbide (SiC) powder and the aluminum oxide ($Al_2O_3$) powder are mixed at a ratio for obtaining a desired volume resistivity value.

Then, the mixed powder is shaped into a predetermined shape by the use of a mold and the resultant shaped body is pressurized and baked, for example, by the use of a hot press (HP), thereby obtaining a silicon carbide-aluminum oxide complex sintered body.

The pressurizing force of hot press (HP) conditions is not particularly limited, but is preferably in the range of 5 to 40 MPa when it is intended to obtain the silicon carbide-aluminum oxide complex sintered body. When the pressurizing force is less than 5 MPa, it is not possible to obtain a complex sintered body with a sufficient sintering density. On the other hand, when the pressurizing force is greater than 40 MPa, a jig made of graphite or the like is deformed and worn.

The baking temperature is preferably in the range of 1650° C. to 1850° C. When the baking temperature is less than 1650° C., it is not possible to obtain a sufficiently dense silicon carbide-aluminum oxide complex sintered body. On the other hand, when the baking temperature is greater than 1850° C., decomposition or particle growth of the sintered body may easily occur in the course of baking the sintered body.

The baking atmosphere is preferably an inert gas atmosphere of argon or nitrogen for the purpose of preventing oxidation of silicon carbide.

A power supply terminal insertion hole 37 is mechanically formed at a predetermined position of one sheet of a complex sintered body of two sheets of the resultant silicon carbide-aluminum oxide complex sintered body, which is used as the support plate 32.

As a coating agent for forming the electrostatic-adsorption inner electrode, a coating agent, which is made into a paste by adding conductive material powder such as molybdenum carbide ($Mo_2C$) to insulating ceramic powder such as aluminum oxide ($Al_2O_3$) at such a ratio that the volume resistivity at the usage temperature of the electrostatic chuck device is in the range of $1.0 \times 10^{-1}$ Ωcm to $1.0 \times 10^8$ Ωcm, is manufactured. The coating agent is applied to a region of the support plate 32 in which the electrostatic-adsorption inner electrode is formed, thereby forming a conductive layer. The coating agent made into a paste containing the insulating ceramic powder such as aluminum oxide ($Al_2O_3$) is applied to a region outside the region in which the conductive layer is formed, thereby forming an insulating layer.

Subsequently, the power supply terminal 27 is inserted into the power supply terminal insertion hole 37 of the support plate 32 with a cylindrical insulator 38 interposed therebetween, the surface of the support plate 32 on which the conductive layer and the insulating layer are formed is superposed on the mounting plate 31, the mounting plate 31 and the support plate 32 are heated and pressurized, for example, at a temperature of 1,600° C. or more, the electrostatic-adsorption inner electrode 25 and the insulating layer 33 as a bonding layer are formed of the conductive layer and the insulating layer, respectively, and then the mounting plate 31 and the support plate 32 are bonded to each other with the electrostatic-adsorption inner electrode 25 and the insulating layer 33 interposed therebetween. Then, the top surface 31a of the mounting plate 31 serving as a mounting surface is polished so that Ra (center-line average roughness) is about 0.3 μm, thereby manufacturing the electrostatic chuck section 22.

On the other hand, the metal base section 23 in which a circular concave portion 34 is formed in the surface thereof and a flow passage 28 for circulating a cooling medium is formed is manufactured using an aluminum (Al) plate. The dielectric plate 24 is manufactured using an aluminum oxide sintered body by shaping and baking aluminum oxide ($Al_2O_3$) powder.

Subsequently, a conductive adhesive bonding agent having a volume resistivity of $1.0 \times 10^{-2}$ Ωcm or less at the usage temperature of the electrostatic chuck device is applied to the entire inner surface of the concave portion 34 of the metal base section 23, the dielectric plate 24 is adhesively bonded onto the conductive adhesive bonding agent, an insulating adhesive bonding agent is applied onto the metal base section 23 including the dielectric plate 24, and then the electrostatic chuck section 22 is adhesively bonded onto the insulating adhesive bonding agent.

At the time of performing the adhesive bonding process, by adjusting the materials and the thicknesses of the conductive adhesive bonding layer 35 and the insulating adhesive bonding layer 36 so that the thermal conductivity is constant in the entire adsorption area of the electrostatic chuck section 22, the thermal conductivity values of the electrostatic chuck section 22 and the metal base section 23 are equal to each other and the in-plane thermal uniformity of the plate-like sample W is enhanced.

For example, when the surface of the dielectric plate 24 facing the conductive adhesive bonding layer 35 has a concentric step shape or a conic shape in which the central portion is thick and the peripheral portion is thin, the thickness of the conductive adhesive bonding layer is made to be small at the center and to be great in the peripheral portion.

When the surface of the dielectric plate 24 facing the insulating adhesive bonding layer 36 has a concentric step shape or a conic shape in which the central portion is thick and the peripheral portion is thin, the thickness of the insulating adhesive bonding layer is made to be small at the center and to be great in the peripheral portion.

Accordingly, it is possible to enhance the in-plane thermal uniformity of the plate-like sample W and thus to perform a uniform plasma process.

In the adhesive bonding process, the dielectric plate 24 is bonded and fixed to the concave portion 34 of the metal base section 23 with the conductive adhesive bonding layer 35 interposed therebetween and the support plate 32 of the electrostatic chuck section 22 is bonded and fixed to the metal base section 23 and the dielectric plate 24 with the insulating adhesive bonding layer 36 interposed therebetween.

In this way, the electrostatic chuck device according to this embodiment can be obtained.

As described above, in the electrostatic chuck device according to this embodiment, the circular concave portion 34 is formed in the surface of the metal base section 23 facing the electrostatic chuck section 22, the dielectric plate 24 is bonded and fixed to the concave portion 34 with the conductive adhesive bonding layer 35 interposed therebetween, the volume resistivity of which at the usage temperature of the electrostatic chuck device is $1.0 \times 10^{-2}$ Ωcm or less, and the support plate 32 of the electrostatic chuck section 22 is adhesively bonded to the dielectric plate 24 with the insulating adhesive bonding layer 36 interposed therebetween. Accordingly, even when a high-frequency voltage is applied to the metal base section 23, the electric field strength on the surface of the electrostatic chuck section 22 can be made to be even.

Even when bubbles or defects occur in the conductive adhesive bonding layer 35, the dielectric constant of the conductive adhesive bonding layer 35 does not vary, thereby not disturbing the plasma distribution. Accordingly, the plasma density on the surface of the plate-like sample can be made to be even, thereby performing a uniform plasma process on the entire surface of the plate-like sample W.

Second Embodiment

Figure 2:
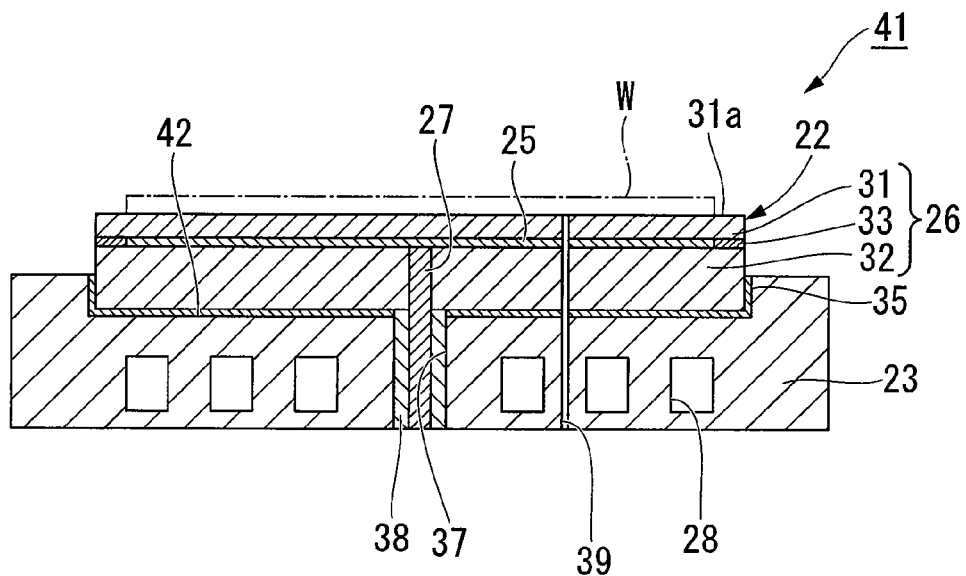
FIG. 2 is a cross-sectional view illustrating an electrostatic chuck device according to a second embodiment of the invention.

FIG. 2 is a cross-sectional view illustrating an electrostatic chuck device 41 according to a second embodiment of the invention. The electrostatic chuck device 41 according to the second embodiment is different from the electrostatic chuck device 21 according to the first embodiment, in that a concave portion 42 having the same shape as the bottom surface of the electrostatic chuck section 22 and having a height smaller than the height of the electrostatic chuck section 22 is formed in a surface (main surface) of the metal base section 23 facing the electrostatic chuck section 22 and the support plate 32 of the electrostatic chuck section 22 is adhesively bonded to the concave portion 42 with the conductive adhesive bonding layer 35 interposed therebetween, the volume resistivity of which at the usage temperature of the electrostatic chuck device is $1.0 \times 10^{-2}$ Ωcm or less.

In the electrostatic chuck device 41, the electrostatic chuck section 22 and the concave portion 42 are adhesively bonded to each other with the conductive adhesive bonding layer 35 interposed therebetween, the volume resistivity of which at the usage temperature of the electrostatic chuck device is $1.0 \times 10^{-2}$ Ωcm or less. Accordingly, even when bubbles or defects occur in the conductive adhesive bonding layer 35, the dielectric constant of the conductive adhesive bonding layer 35 does not vary, thereby not disturbing the plasma distribution. Accordingly, the plasma density on the surface of the plate-like sample W can be made to be even, thereby performing a uniform plasma process on the entire surface of the plate-like sample W.

A clearance between the concave portion 42 and the substrate 26 is preferably 0.1% or more of a diameter when the substrate 26 is circular, more preferably 0.2% or more, and still more preferably 0.3% or more.

The clearance is preferably 0.1% or more of a diagonal length when the substrate 26 is rectangular, more preferably 0.2% or more, and still more preferably 0.3% or more.

Here, when the clearance between the concave portion 42 and the substrate 26 is less than 0.1%, the metal base section 23 can be easily warped due to a difference in thermal expansion coefficient between the substrate 26 and the metal base section 23. Due to the warping, the substrate 26 of the electrostatic chuck section 22 may be damaged or the adhesive bonding layer 35 between the metal base section 23 and the substrate 26 may be peeled off.

The clearance between the concave portion 42 and the substrate 26 is preferably 2.0 mm or less as a numerical value, more preferably 1.5 mm or less, and still more preferably 1.0 mm or less.

When the clearance between the concave portion 42 and the substrate 26 is greater than 2.0 mm, the in-plane uniformity of the plate-like sample W is deteriorated, thereby not to be performed the uniform plasma process.

In the electrostatic chuck device 41 according to this embodiment, the concave portion 42 and the support plate 32 of the electrostatic section 22 are adhesively bonded to each other with the conductive adhesive bonding layer 35 interposed therebetween, the volume conductivity of which at the usage temperature of the electrostatic chuck device is $1.0 \times 10^{-2}$ Ωcm or less. Accordingly, even when a high-frequency voltage is applied to the metal base section 23, and even when bubbles or defects occur in the conductive adhesive bonding layer 35 or the thickness thereof varies, the dielectric constant of the conductive adhesive bonding layer 35 does not vary, thereby not disturbing the plasma distribution. Accordingly, the plasma density on the surface of the plate-like sample W can be made to be even, thereby performing a uniform plasma process on the entire surface of the plate-like sample W.

It is also possible to easily and satisfactorily position and fix the metal base section 23 and the electrostatic chuck section 22 relative to each other.

Third Embodiment

Figure 3:
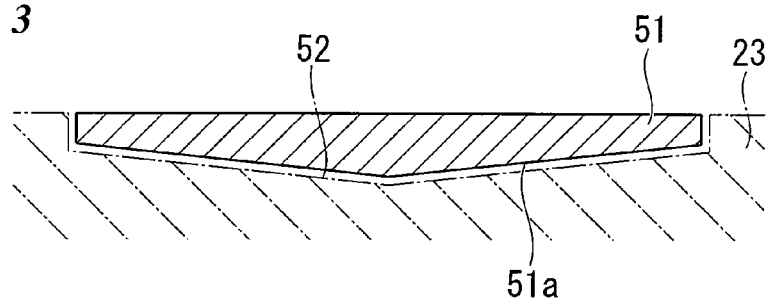
FIG. 3 is a cross-sectional view illustrating a dielectric plate of an electrostatic chuck device according to a third embodiment of the invention.

FIG. 3 is a cross-sectional view illustrating a dielectric plate 51 of an electrostatic chuck device according to a third embodiment of the invention. The dielectric plate 51 according to the third embodiment is different from the dielectric plate 24 according to the first embodiment, in that a bottom surface 51a of the dielectric plate 51 is formed in a cone shape so that the thickness of the dielectric plate 51 concentrically and gradually decreases from the center to the peripheral edge thereof.

When the dielectric plate 51 is employed, it is possible to easily and satisfactorily position and fix the metal base section 23 and the dielectric plate 51 relative to each other, by forming a concave portion 52, which has a shape complementary to the bottom surface 51a of the dielectric plate 51, in the metal base section 23.

In the dielectric plate 51 according to this embodiment, since the thickness thereof concentrically and gradually decreases from the center to the peripheral edge, it is possible to make even the plasma distribution in which a portion closer to the center has a higher density and to make even the plasma density on the surface of the plate-like sample W.

By forming the concave portion 52, which has a shape complementary to the bottom surface 51a of the dielectric plate 51, in the metal base section 23, it is possible to easily and satisfactorily position and fix the metal base section 23 and the dielectric plate 51 relative to each other.

Fourth Embodiment

Figure 4:
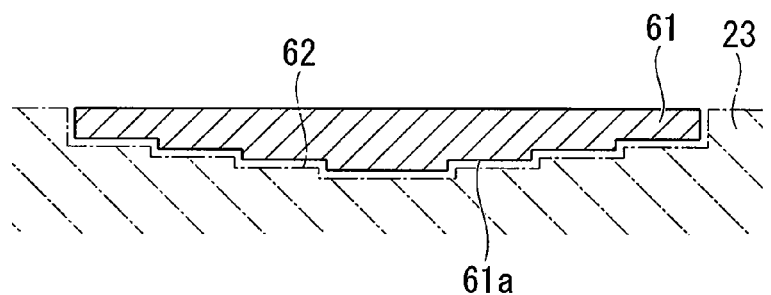
FIG. 4 is a cross-sectional view illustrating a dielectric plate of an electrostatic chuck device according to a fourth embodiment of the invention.

FIG. 4 is a cross-sectional view illustrating a dielectric plate 61 of an electrostatic chuck device according to a fourth embodiment of the invention. The dielectric plate 61 according to the fourth embodiment is different from the dielectric plate 24 according to the first embodiment, in that the bottom surface 61a of the dielectric plate 61 is formed in a sectional step shape so that the thickness of the dielectric plate 61 concentrically and stepwise decreases from the center to the peripheral edge.

When the dielectric plate 61 is employed, it is possible to easily and satisfactorily position and fix the metal base section 23 and the dielectric plate 61 relative to each other, by forming a concave portion 62, which has a shape complementary to the bottom surface 61a of the dielectric plate 61, in the metal base section 23.

In the dielectric plate 61 according to this embodiment, since the thickness thereof concentrically and stepwise decreases from the center to the peripheral edge, it is possible to make even the plasma distribution in which the central portion has a high density and to make even the plasma density on the surface of the plate-like sample W.

By forming the concave portion 62, which has a shape complementary to the bottom surface 61a of the dielectric plate 61, in the metal base section 23, it is possible to easily and satisfactorily position and fix the metal base section 23 and the dielectric plate 61 relative to each other.

Fifth Embodiment

Figure 5:
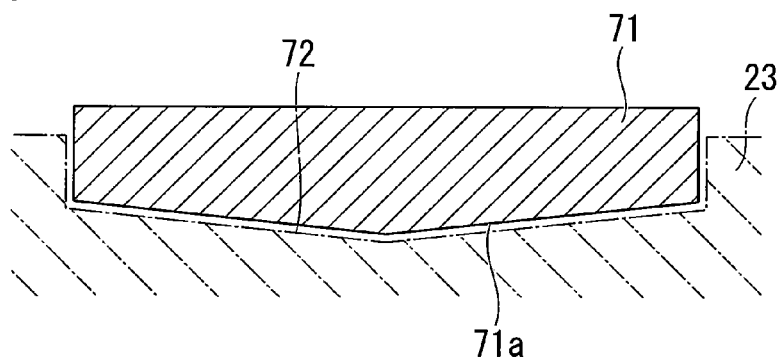
FIG. 5 is a cross-sectional view illustrating a support plate of an electrostatic chuck device according to a fifth embodiment of the invention.

FIG. 5 is a cross-sectional view illustrating a support plate 71 of an electrostatic chuck device according to a fifth embodiment of the invention. The support plate 71 according to the fifth embodiment is different from the support plate 32 according to the second embodiment, in that a bottom surface 71a of the support plate 71 is formed in a cone shape so that the thickness of the support plate 71 concentrically and gradually decreases from the center to the peripheral edge thereof.

When the support plate 71 is employed, it is possible to easily and satisfactorily position and fix the metal base section 23 and the support plate 71 relative to each other, by forming a concave portion 72, which has a shape complementary to the bottom surface 71a of the support plate 71, in the metal base section 23.

In the support plate 71 according to this embodiment, since the thickness thereof concentrically and gradually decreases from the center to the peripheral edge, it is possible to make even the plasma distribution in which a portion closer to the center has a higher density and to make even the plasma density on the surface of the plate-like sample W.

By forming the concave portion 72, which has a shape complementary to the bottom surface 71a of the support plate 71, in the metal base section 23, it is possible to easily and satisfactorily position and fix the metal base section 23 and the support plate 71 relative to each other.

Sixth Embodiment

Figure 6:
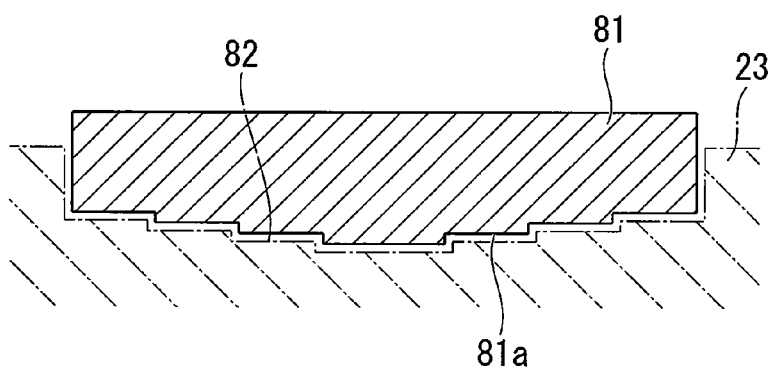
FIG. 6 is a cross-sectional view illustrating a support plate of an electrostatic chuck device according to a sixth embodiment of the invention.

FIG. 6 is a cross-sectional view illustrating a support plate 81 of an electrostatic chuck device according to a sixth embodiment of the invention. The support plate 81 according to the sixth embodiment is different from the support plate 32 according to the second embodiment, in that the bottom surface 81a of the support plate 81 is formed in a sectional step shape so that the thickness of the support plate 81 concentrically and stepwise decreases from the center to the peripheral edge.

When the support plate 81 is employed, it is possible to easily and satisfactorily position and fix the metal base section 23 and the support plate 81 relative to each other, by forming a concave portion 82, which has a shape complementary to the bottom surface 81a of the support plate 81, in the metal base section 23.

In the support plate 81 according to this embodiment, since the thickness thereof concentrically and stepwise decreases from the center to the peripheral edge, it is possible to make even the plasma distribution in which the central portion has a high density and to make even the plasma density on the surface of the plate-like sample W.

By forming the concave portion 82, which has a shape complementary to the bottom surface 81a of the support plate 81, in the metal base section 23, it is possible to easily and satisfactorily position and fix the metal base section 23 and the support plate 81 relative to each other.

Seventh Embodiment

Figure 7:
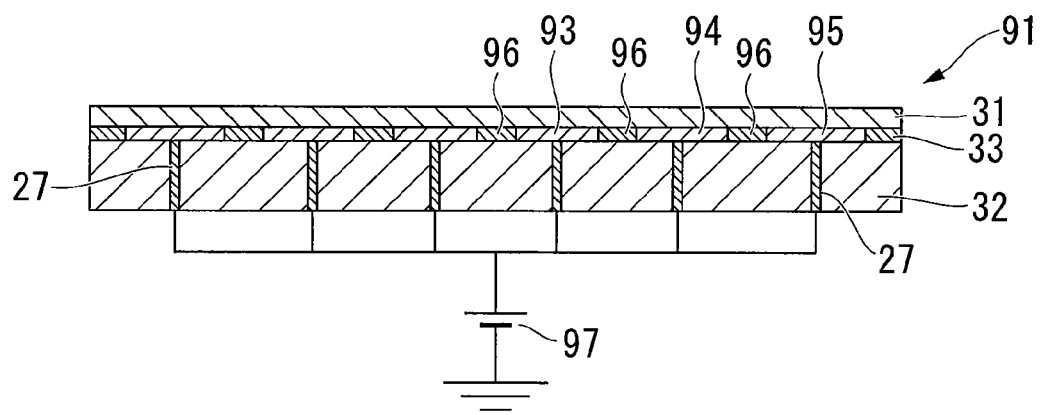
FIG. 7 is a cross-sectional view illustrating a substrate of an electrostatic chuck device according to a seventh embodiment of the invention.

FIG. 7 is a cross-sectional view illustrating a substrate 91 of an electrostatic chuck device according to a seventh embodiment of the invention. The substrate 91 according to the seventh embodiment is different from the substrate 26 according to the first embodiment, in that the electrostatic-adsorption inner electrode interposed between the mounting plate 31 and the support plate 32 includes a plurality of concentric electrode portions 93 to 95, insulating layers 96 are formed between the electrode portions 93 to 95 and at the central portion thereof, power supply terminals 27, . . . are connected to the electrode portions 93 to 95, respectively, and the power supply terminals 27, . . . are grounded through a DC power source 97.

In the electrostatic chuck device according to this embodiment, the electrostatic-adsorption inner electrode includes a plurality of concentric electrode portions 93 to 95, the insulating layers 96 are formed between the electrode portions 93 to 95 and at the central portion thereof, and the power supply terminals 27, . . . are connected to the electrode portions 93 to 95, respectively. Accordingly, when a high-frequency voltage is applied, it is possible to prevent high-frequency current from flowing through the electrostatic-adsorption inner electrode and thus to make even the plasma distribution in which a portion closer to the center has a higher density.

Eighth Embodiment

Figure 8:
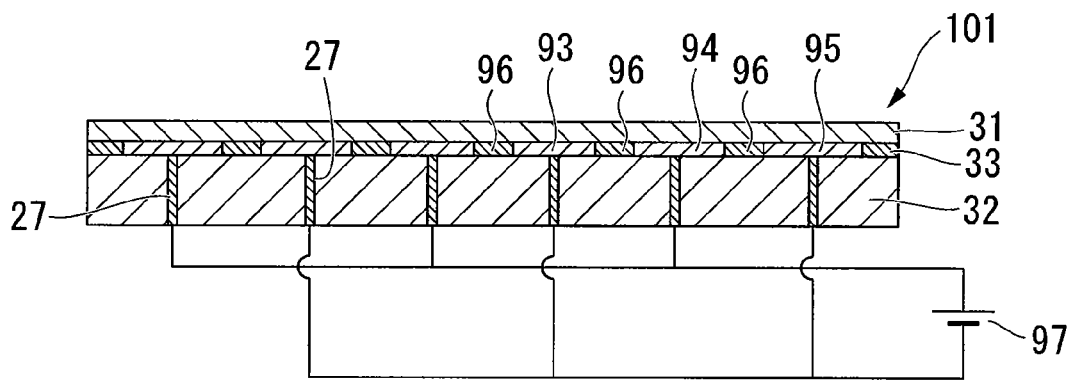
FIG. 8 is a cross-sectional view illustrating a substrate of an electrostatic chuck device according to an eighth embodiment of the invention.

FIG. 8 is a cross-sectional view illustrating a substrate 101 of a bipolar electrostatic chuck device according to an eighth embodiment of the invention. The substrate 101 according to the eighth embodiment is different from the substrate 91 according to the seventh embodiment, in that the plurality of electrode portions 93 to 95 are connected to a DC power source 97 through the power supply terminals 27, . . . , thereby constituting a bipolar electrostatic chuck device.

This embodiment can obtain the same advantages as the seventh embodiment.

Ninth Embodiment

Figure 9:
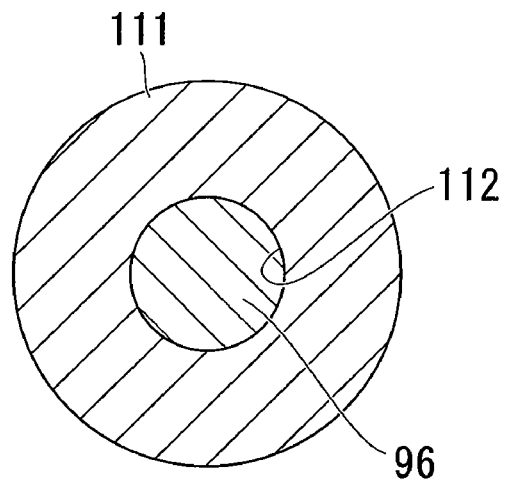
FIG. 9 is a plan view illustrating an electrostatic-adsorption inner electrode of an electrostatic chuck device according to a ninth embodiment of the invention.

FIG. 9 is a plan view illustrating an electrostatic-adsorption inner electrode 111 of an electrostatic chuck device according to a ninth embodiment of the invention. The electrostatic-adsorption inner electrode 111 according to the ninth embodiment is different from the electrostatic-adsorption inner electrode 25 according to the first embodiment, in that a circular opening 112 having an area in the range of 1/9 to 4/9 of the entire area of the electrostatic-adsorption inner electrode 111 is formed at the center thereof and the opening 112 is filled with an insulating layer 96.

In the electrostatic-adsorption inner electrode 111, by forming the opening 112 having an area in the range of 1/9 to 4/9 of the entire area of the electrostatic-adsorption inner electrode 111 at the center thereof and filling the opening 112 with the insulating layer 96, when a high-frequency voltage is applied the high-frequency current hardly flows toward the outer peripheral through the electrostatic-adsorption inner electrode 111, thereby flattening the plasma distribution in which a portion closer to the center has a higher density.

In the electrostatic-adsorption inner electrode according to this embodiment, the opening 112 having an area in the range of 1/9 to 4/9 of the entire area of the electrostatic-adsorption inner electrode 111 is formed at the center of the electrostatic-adsorption inner electrode 111 and the opening 112 is filled with the insulating layer 96. Accordingly, even when a high-frequency voltage is applied thereto, it is possible to prevent the high-frequency current from flowing toward the outer peripheral through the electrostatic-adsorption inner electrode 111 and thus to make even the plasma distribution in which a portion closer to the center has a higher density.

Tenth Embodiment

Figure 10:
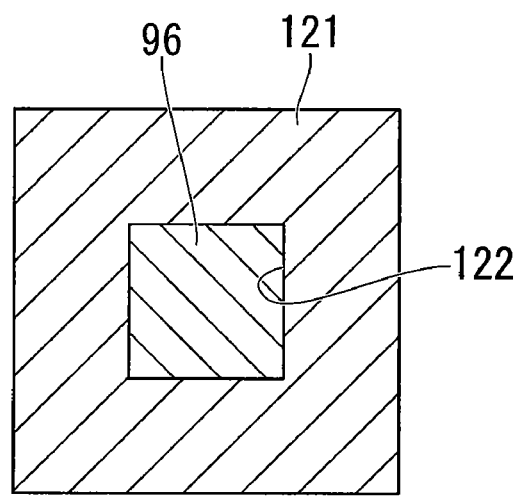
FIG. 10 is a plan view illustrating an electrostatic-adsorption inner electrode of an electrostatic chuck device according to a tenth embodiment of the invention.
Figure 11:
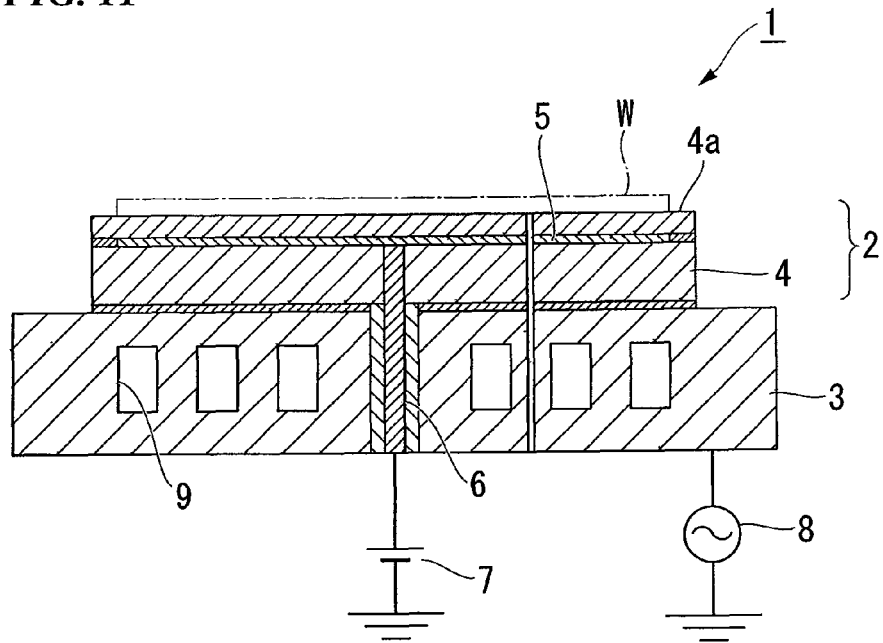
FIG. 11 is a cross-sectional view illustrating an example of a known electrostatic chuck device.
Figure 12:
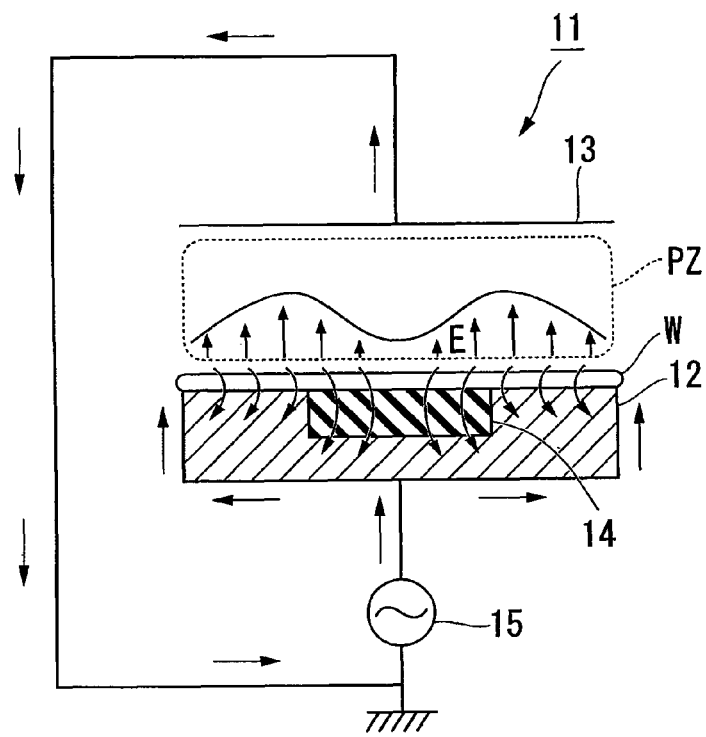
FIG. 12 is a cross-sectional view illustrating an example of a known plasma processing apparatus.
Figure 13:
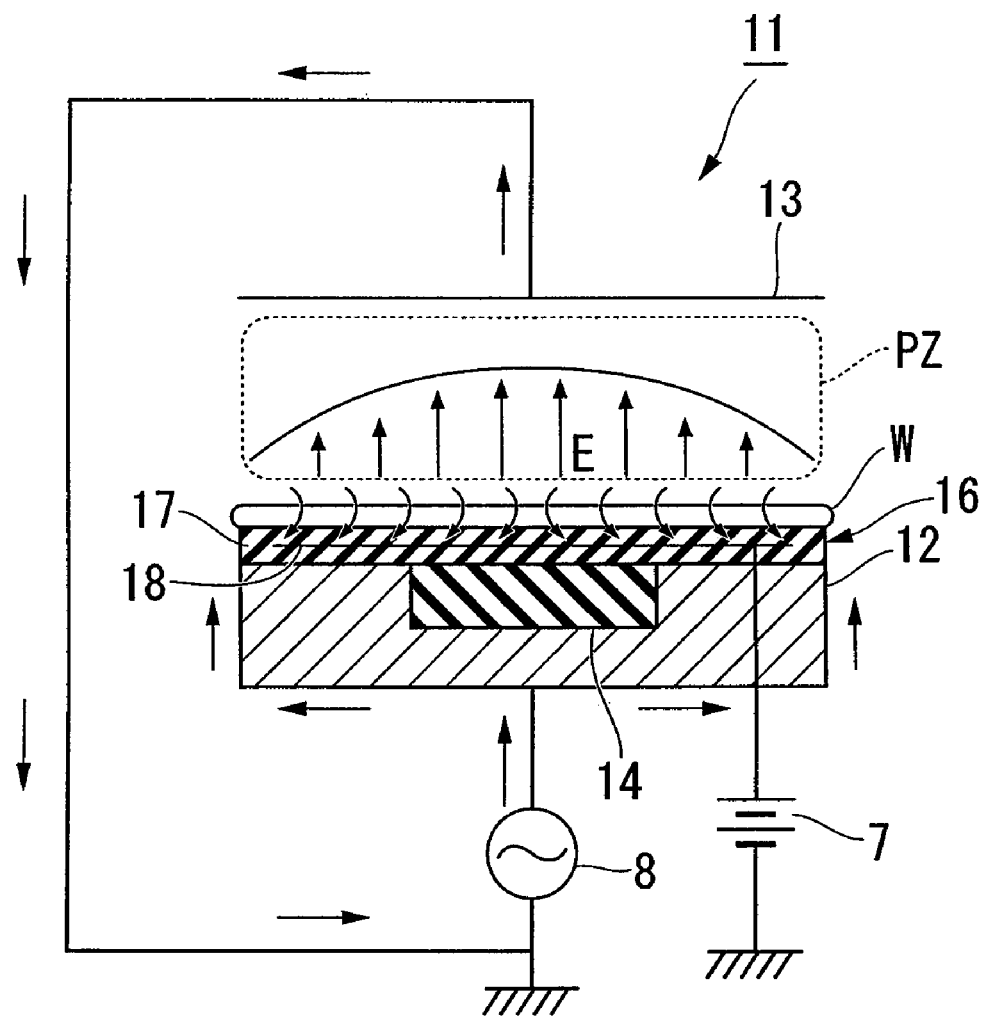
FIG. 13 is a cross-sectional view illustrating an example of a plasma processing apparatus mounted with a known electrostatic chuck device.

FIG. 10 is a plan view illustrating an electrostatic-adsorption inner electrode 121 of an electrostatic chuck device according to a tenth embodiment of the invention. The electrostatic-adsorption inner electrode 121 according to this embodiment is different from the electrostatic-adsorption inner electrode 111 according to the ninth embodiment, in that the whole shape is rectangular, a rectangular opening 122 having an area in the range of 1/9 to 4/9 of the entire area of the electrostatic-adsorption inner electrode 121 is formed at the center thereof, and the opening 122 is filled with an insulating layer 96.

In this embodiment, it is possible to obtain the same advantages as the ninth embodiment.

While preferred embodiments of the invention have been described and illustrated above, it should be understood that these are exemplary of the invention and are not to be considered as limiting the invention. Additions, omissions, substitutions, and other modifications can be made without departing from the spirit or scope of the invention. Accordingly, the invention is not to be considered as being limited by the foregoing description, and is only limited by the scope of the appended claims.

What is claimed is:

1. An electrostatic chuck device comprising:
    an electrostatic chuck section including a substrate, wherein the electrostatic chuck section has a main surface serving as a mounting surface on which a plate-like sample is mounted and an electrostatic-adsorption inner electrode built therein, and a power supply terminal for applying a DC voltage to the electrostatic-adsorption inner electrode; and
    a metal base section, having a concave portion on the main surface thereof to which a dielectric plate is adhesively bonded/fixed with a conductive adhesive bonding layer having a volume resistivity of $1.0 \times 10^{-2}$ Ωcm or less, wherein the dielectric plate is fixed/bonded to the other main surface of the electrostatic chuck section so as to incorporate the metal base section into a body and have the metal base section serve as a high frequency generating electrode,
    wherein the dielectric plate and the electrostatic chuck section are adhesively bonded to each other with an insulating adhesive bonding layer interposed therebetween, wherein the thickness of the dielectric plate decreases from the center to the peripheral edge.

2. An electrostatic chuck device according to claim 1, wherein the clearance between the dielectric plate and the concave portion is 0.1% or more of a diameter when the dielectric plate is circular and 0.1% or more of a diagonal length of a rectangular when the dielectric plate is rectangular.

3. An electrostatic chuck device according to claim 1, wherein the clearance between the dielectric plate and the concave portion is 2.0 mm or less.

4. An electrostatic chuck device according to claim 1, wherein the concave portion has a shape complementary to that of the main surface of the dielectric plate facing the concave portion.

5. An electrostatic chuck device according to claim 1, wherein the thermal conductivity between the electrostatic chuck section and the metal base section is uniform in the entire adsorption area of the electrostatic chuck section.

6. An electrostatic chuck device according to claim 1, wherein the conductive adhesive bonding layer comprising a silicon-based adhesive bonding agent containing a conductive filler or a metal-based adhesive bonding agent.

7. An electrostatic chuck device according to claim 1, wherein the electrostatic-adsorption inner electrode comprising a plurality of concentric electrode portions insulated from each other and the power supply terminals are connected to the respective electrode portions.

8. An electrostatic chuck device according to claim 1, wherein an opening having an area in the range of ⅕ to ⅘ of the entire area of the electrostatic-adsorption inner electrode is formed at the central portion of the electrostatic-adsorption inner electrode and the opening is filled with an insulating material.

9. The electrostatic chuck device of claim 1, in combination with a plasma processing apparatus, wherein the electrostatic chuck device is incorporated in said plasma processing apparatus.

10. A plasma processing device comprising an electrostatic chuck device, said chuck device comprising:
an electrostatic chuck device including:
an insulating substrate, wherein the electrostatic chuck section has a main surface serving as a mounting surface on which a plate-like sample is mounted;
an electrostatic-adsorption inner electrode built in the substrate;
a power supply terminal for applying a DC voltage to the electrostatic-adsorption inner electrode; and
a metal base section supporting the other main surface of the electrostatic chuck section so as to incorporate the metal base section into a body and having the metal base section serve as a high frequency generating electrode;
a concave portion formed on the main surface of the metal base section, the portion facing the other main surface of the electrostatic chuck section;
a dielectric plate fitting the concave portion;
an insulating adhesive bonding layer which adhesively bonds the dielectric plate and the electrostatic chuck section; and
a conductive adhesive bonding layer which adhesively bonds the dielectric plate and the metal base section;
wherein a volume resistivity of the conductive adhesive bonding layer is $1.0 \times 10^{-2}$ Ωcm or less, and the thickness of the dielectric plate decreases from the center to the peripheral edge.

11. A plasma processing device comprising the electrostatic chuck device according to claim 10, wherein the clearance between the dielectric plate and the concave portion is 0.1% or more of a diameter when the dielectric plate is circular, and 0.1% or more of a diagonal length of a rectangular when the dielectric plate is rectangular.

12. A plasma processing device comprising the electrostatic chuck device according to claim 11, wherein the clearance is 2.0 mm or less.

13. A plasma processing device comprising the electrostatic chuck device according to claim 10, wherein the conductive adhesive bonding layer comprises silicon-based adhesive bonding agent containing a conductive filler or a metal-based adhesive.

14. A plasma processing device comprising the electrostatic chuck device according to claim 10, wherein the electrostatic-adsorption inner electrode comprises a plurality of concentric electrode portions insulated from each other.

15. A plasma processing device comprising the electrostatic chuck device according to claim 10, wherein an opening having an area in the range of ⅕ to ⅘ of the entire area of the electrostatic-adsorption inner electrode is formed at the central portion of the electrostatic-adsorption inner electrode and the opening is filled with an insulating material.

* * * * *